United States Patent
Barthel

(10) Patent No.: US 11,023,114 B2
(45) Date of Patent: Jun. 1, 2021

(54) MEASUREMENT APPARATUS AND MEASUREMENT METHOD

(71) Applicant: Rohde & Schwarz GmbH & Co. KG, Munich (DE)

(72) Inventor: Sven Barthel, Chemnitz (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 0 days.

(21) Appl. No.: 16/397,717

(22) Filed: Apr. 29, 2019

(65) Prior Publication Data

US 2020/0341620 A1    Oct. 29, 2020

(51) Int. Cl.
*G06F 3/0484* (2013.01)
*G06F 3/0481* (2013.01)
*G01R 13/34* (2006.01)

(52) U.S. Cl.
CPC ......... *G06F 3/04845* (2013.01); *G01R 13/34* (2013.01); *G06F 3/0481* (2013.01); *G06F 2203/04806* (2013.01)

(58) Field of Classification Search
CPC ....... G06F 3/04845; G06F 2203/04806; G06F 3/0481; G01R 13/34
See application file for complete search history.

(56) References Cited

U.S. PATENT DOCUMENTS

| | | | | |
|---|---|---|---|---|
| 7,401,007 B1* | 7/2008 | Su | .................... | G01R 19/2509 324/76.11 |
| 9,577,798 B1 | 2/2017 | Melis et al. | | |
| 2002/0080149 A1* | 6/2002 | Alexander | ........... | G01R 13/345 345/634 |
| 2003/0043142 A1* | 3/2003 | Ishibashi | ............ | H04N 21/4143 345/213 |
| 2004/0183818 A1* | 9/2004 | Beasley | ............. | G01R 13/0236 345/660 |
| 2009/0131792 A1* | 5/2009 | Yawata | ................... | A61B 8/461 600/441 |
| 2010/0245389 A1* | 9/2010 | Aoki | .................... | G01R 13/0245 345/641 |
| 2014/0215379 A1 | 7/2014 | Purdy et al. | | |
| 2014/0240240 A1* | 8/2014 | Beck | .................... | G06F 3/04845 345/173 |
| 2014/0320145 A1 | 10/2014 | Johnson et al. | | |
| 2016/0070461 A1* | 3/2016 | Herbordt | ............. | G06F 3/04883 345/178 |
| 2018/0095638 A1* | 4/2018 | Merg | ....................... | H04W 4/70 |
| 2018/0184931 A1* | 7/2018 | Chen | ...................... | A61B 5/361 |
| 2019/0139552 A1* | 5/2019 | Kim | ...................... | G06F 16/433 |
| 2019/0200887 A1* | 7/2019 | Shinohara | ............ | A61B 5/0042 |
| 2019/0282176 A1* | 9/2019 | Yamagata | ............ | A61B 5/7425 |

OTHER PUBLICATIONS

Juergen Carstens, Waveform Signal Zoom Utility, Feb. 12, 2010, Siemens (Year: 2010).*

* cited by examiner

*Primary Examiner* — Daeho D Song
(74) *Attorney, Agent, or Firm* — Westman, Champlin & Koehler, P.A.

(57) ABSTRACT

An automated zooming of a signal waveform by a measurement device is provided. Vertical parameters of a zoom window for zooming a signal waveform are automatically determined. For this purpose, an acquired measurement signal is tracked and the parameters of the zoom window are set based on the tracking of the measurement signal.

20 Claims, 3 Drawing Sheets

MEASUREMENT APPARATUS AND MEASUREMENT METHOD

TECHNICAL FIELD

The present invention relates to a measurement apparatus. The present invention further relates to a measurement method.

BACKGROUND

Although applicable in principle to any measurement system, the present invention and its underlying problem will be hereinafter described in combination with an oscilloscope.

Measurement devices such as an oscilloscope may be used for measuring a number of one or more signals and providing a waveform of the measured signals to a user. After providing an overview of the measured signal to the user, a user may zoom the provided waveform at a specific position. For this purpose, the user may determine a zoom window specifying an area of interest of the provided overview of the measured signal.

However, when having high zoom factors, it might be very difficult to precisely specify a point of interest and a corresponding zoom window. Thus, a user may require multiple attempts in order to specify the desired position which shall be zoomed. For example, a user may tap on a touch screen in order to roughly specify the desired position on a provided overview of the measurement signal. Afterwards, the user may further specify the desired position by means of additional input elements such as a rotary knob or numerical inputs to re-adjust the selected position. Thus, specifying a desired zoom window of a measured signal may be a complex and time consuming task.

Against this background, there is a need to provide a simplified selection of an appropriate zoom window in order to process a zooming of a measured signal. In particular, there is a need for an improved and at least partly automated selection of an appropriate zoom window when measuring signals.

SUMMARY

The present invention provides a measurement apparatus and a measurement method with the features of the independent claims. Further advantageous embodiments are subject matter of the dependent claims.

According to a first aspect, a measurement apparatus is provided. The measurement apparatus comprises a measurement device and a processing device. The measurement device is configured to acquire a measurement signal. The processing device is configured to receive a horizontal position of a zoom window. The processing device is further configured to generate a view representing a zoomed section of the acquired measurement signal. The view of the zoomed section is generated according to the specification of the zoom window. In particular, the processing device is configured to vertically track the acquired measurement signal and to adapt the vertical zooming of the acquired measurement signal based on the vertical tracking.

According to a further aspect, a measurement method is provided. The method comprises acquiring a measurement signal and receiving a horizontal position of a zoom window. The method further comprises vertically tracking the acquired measurement signal and generating a view representing a zoomed section of the acquired measurement signal according to the zoom window. The vertically zooming of the acquired measurement signal is based on the vertical tracking. In particular, the vertical tracking of the acquired measurement signal is performed in a section of the measurement signal according to the zoom window.

The present invention is based on the finding that a precise specification of a desired zoom window for zooming a measurement signal may be a complex and time consuming task. In particular, when zooming the measurement signal with a high zoom factor, the position and the width of the zooming has to be specified very precisely.

The present invention therefore provides an automated assistance for specifying appropriate zoom parameters. In particular, a vertical zooming of an acquired measurement signal is provided such that a view of the zoomed measurement signal provides an appropriate vertical zooming.

It is for this purpose that the vertical zooming of the acquired measurement signal is automatically set such that the generated view of the zoomed measurement signal comprises an appropriate zoom window covering the whole range of the signal values of the measurement signal. In this way, the view of the zoomed measurement signal provides a representation of the desired segment of the measurement signal, which can be precisely analyzed. By automatically setting the parameters of the horizontal zooming in an appropriate manner, the visualization of the zoomed measurement signal is improved and the required time for configuring the measurement device is minimized. Thus, by assisting the user for setting the zoom parameters accordingly, the time for performing the measurement operation can be reduced. Furthermore, the measurement results may be also improved by an enhanced visualization of the zoomed measurement signal.

The measurement apparatus may be any kind of measurement apparatus for measuring a number of one or more signals, in particular electronic signals. For example, the measurement apparatus may be an oscilloscope. However, any other kind of measurement apparatus acquiring two-dimensional signals may be also possible.

The measurement apparatus may measure any kind of electric signal, in particular electric signals comprising a signal component having a periodicity. The measurement signal may be also a non-periodic signal which may be overlaid with a further signal, e.g. a disturbance or the like, having a periodicity.

The measurement device of the measurement apparatus may receive the measurement signal and process the received measurement signal for a further analysis. For example, the measurement apparatus may comprise elements such as an amplifier, an attenuator, filter elements, etc. The measurement apparatus may also comprise an analog to digital converter for digitizing a received analog signal to digital data. The analog to digital converter may digitize the received measurement signal with a predetermined sampling rate, resolution, etc. Furthermore, the digitized data may be stored in a measurement apparatus for further analysis.

The analysis of the acquired measurement signal may be performed, for example, by providing a graphical representation of the acquired measurement signal. For this purpose, a view of the signal waveform of the acquired measurement signal may be provided to a user. The acquired measurement signal may be processed by the processing device of the measurement apparatus. For example, the processing device may generate a first view representing an overview of the whole acquired measurement signal. For example, the overview may represent a signal waveform of the acquired measurement signal for a specific period of time. The acquisition of the measurement signal may be started when a predetermined trigger event is detected. After detecting the specific trigger event, the acquisition of the measurement signal may be performed for a predetermined period of time. Furthermore, it may be even possible to acquire measurement data relating to a specific period of time before the trigger event occurs. However, any other scheme for acquiring the measurement signal may be also possible.

The vertical section of a measurement apparatus usually addresses the attenuation or amplification of a measurement signal. For example, the vertical section of the measurement apparatus may use a control for varying "volts per division", which changes the attenuation or amplification e.g. to fit the measurement signal to the display.

The horizontal section of the measurement apparatus may be related to a time base of the measurement apparatus. For example, the horizontal section may be related to "seconds per division" and may control the amount of time per division which is shown horizontally across the display.

Accordingly, the measurement apparatus may provide a two-dimensional representation of a measurement signal, wherein the values of the measurement signal are shown in vertical direction and the horizontal direction represents the variation of the signal over time. For example a signal curve may represent a voltage over time. However, it is understood, that any other kind of two-dimensional representation may be provided, too.

For instance, it might be also possible to measure any other kind of measurement variable, e.g. a current, and to provide a representation of the respective measurement value over time. Furthermore, it might be also possible to provide any other two-dimensional representation relating to directly measured values or a variable derived from a measured signal. For example, a measured signal might be transformed in a frequency domain, and a representation of signal amplitude (e.g. in vertical direction) might be provided over the frequency range (e.g. in horizontal direction).

The processing device may receive the measurement signal from the measurement device. For example, the processing device may receive digital data corresponding to the measurement signal received by the measurement device and digitized by the measurement device. Furthermore, it may be possible that the measurement device may store the data of the acquired measurement signal in a memory, and the processing device reads the data corresponding to the measurement signal from the memory.

The processing device may generate at least a view representing a zoomed section of the acquired measurement signal. For this purpose, horizontal parameters of the zoom window, e.g. the horizontal position and width with respect to the measurement signal may be specified by appropriate parameters. This parameters for specifying the horizontal parameters of the zoom windows may be received, for example, from a user. Furthermore, the horizontal parameters may be determined automatically, at least in part. For example, a specific position or segment of the measurement signal may be determined based on predetermined characteristics of the measurement signal.

For example, a horizontal position may be automatically determined based on a rising or falling edge, a predetermined signal value or any other characteristic of the measurement signal. In this way, a start position and/or an end position of the zoom window in horizontal direction may be determined. Furthermore, it may be also possible to automatically set a horizontal width of the zoom window. For example, the zoom window may have a predetermined length, in particular a predetermined number of samples, or the width may refer to a predetermined period of time. However, any other feature for determining a width of the zoom window may be also possible.

The processing device may further determine the parameters of the zoom window in horizontal direction. For this purpose, a start position and/or an end position of the zoom window in horizontal direction may be determined. Furthermore, it may be possible to determine a height of the zoom window, i.e. a vertical extent of the zoom window. For example, the processing device may determine a minimum and/or a maximum value of the measurement signal within the segment of the measurement signal relating to the horizontal dimension of the zoom window. Accordingly, the vertical dimension of the zoom window may be set such that all values of the measurement signal are covered by the zoom window. Alternatively, it may be possible to determine a mean value of the measurement signal within the section according to the horizontal dimension of the zoom window. In this case, the horizontal position of the zoom window may be located such that the mean value of the measurement signal is in the middle of the zoom window. Furthermore, the vertical dimension of the zoom window may be set according to a standard deviation of the values within the section according to the horizontal dimension of the zoom window, or according to minimum/maximum values or another scheme, for example according to statistical analysis of the values of the measurement signal. However, it is understood that any other appropriate manner for determining the horizontal extent and position of the zoom window may be also possible.

Accordingly, after the horizontal and vertical parameters of the zoom window have been determined, the processing device may generate a zoomed representation of the measurement signal within the zoom window.

The processing device may comprise, for example, a number of one or more general purpose processors with corresponding instructions. Furthermore, the processing unit may comprise a memory for providing instructions which may be executed by a processor to perform the desired operations. The processor may further execute an operating system that loads and executes the instructions. The processor may be, for example, an Intel processor that runs a Windows or Linux operating system that loads and executes the instructions. Furthermore, the processor may be processor that runs an embedded operating system for loading and executing the respective instructions.

Further embodiments of the present invention are subject of further subclaims and of the following description, referring to the drawings.

In a possible embodiment, the vertical tracking of the acquired measurement signal comprises adapting a vertical position of the zoom window and/or adapting a vertical zoom factor according to the values of the acquired measurement signal in the zoom window.

As already described above, a vertical position of the zoom window may be determined by any appropriate manner. For example, a minimum and maximum value of the measurement signal within the segment specified by the horizontal dimension of the zoom window may be determined, and the zoom window may be set such that all values of the measurement signal are covered by the vertical extent of the zoom window. Accordingly, the vertical beginning and the ending of the zoom window may set based on the minimum and maximum values of the measurement signal. It may be also possible to perform any kind of analysis of the values of the measurement signal within the section according to the horizontal extent of the zoom window, for example determining a mean value, a standard deviation or the like.

Furthermore, a zoom factor may be set in appropriate manner. For example, a vertical zoom factor may be determined such that the waveform of the zoomed measurement signal fits the desired extent of the view, which is generated by the processing device. For this purpose, any appropriate scheme for determining an appropriate zoom factor may be possible.

In a possible embodiment, the processing device is configured to perform the vertical tracking of the acquired measurement signal each time when a predetermined event is detected.

For example, the processing device may monitor the measurement signal, in particular the segment of the measurement signal relating to the horizontal dimension of the zoom window. When a specific characteristic feature is detected, the processing device may adapt the vertical parameters of the zoom window. For example, the processing device may monitor the values of the measurement signal. If a value is detected which is higher than the upper limit of the zoom window, or a value which is lower than the lower edge of the zoom window, the zoom window is adapted accordingly. It may be also possible to analyze the mean value of the measurement signal within the zoom window and to shift the zoom window accordingly. Any other kind of analysis for adapting the zoom window upon detecting a particular feature of the measurement signal may be also possible.

In a possible embodiment, the measurement apparatus may comprise an input button for receiving a user input. For example, the input button may be a soft key of a touch-screen. However, any other kind of input element for receiving a user input may be also possible. The processing unit may be configured to perform the vertical tracking when a user input is received by the input button. Accordingly, the vertical tracking and thus, the configuration of the vertical parameters of the zoom window may be set upon receiving a request from a user.

In a possible embodiment, the processing unit is configured to continuously perform the vertical tracking of the acquired measurement signal.

Accordingly, the processing unit may continuously analyze the values of the measurement signal, in particular the values of the measurement signal within a segment relating to the horizontal dimension of the zoom window. Furthermore, the processing unit may continuously adapt the position, size and/or zoom factor according to the current values of the measurement signal. For example, the upper limit of the zoom window may continuously set according to the highest value of the measurement signal within the zoom window, the lower limit of the zoom window may set according to the lowest value of the measurement signal, a position of the zoom window may set according to the values of the measurement signal, for example according to a mean value, or any other scheme for adapting the zoom window based on the values of the measurement signal may be applied. In particular, the values of the measurement signal are continuously monitored and the zoom window is adapted accordingly.

In a possible embodiment, the processing unit is configured to perform the vertical tracking of the acquired measurement signal periodically. In particular, the tracking is performed in predetermined time intervals.

The time intervals may be fixed or set, for example by a user. In this way, a repetitive configuration of the parameters for the zoom window can be achieved. For example, the zoom window may be adapted in time intervals of a second, two seconds, five seconds or time intervals lower than a second, for example 500 ms, 100 ms, 10 ms, or any other appropriate time interval.

In a possible embodiment, the processing unit is configured to generate a further view representing an overview of the acquired measurement signal.

The overview may represent a signal waveform of the acquired measurement signal. For example, the overview may represent the acquired measurement signal according to a predetermined time period, in particular a time period which is significantly longer than the time period, which is represented by the zoomed view. The overview may relate to a whole signal sequence acquired by the measurement device. However, the overview may relate to any other appropriate representation of the measurement signal, in particular a representation of the measurement signal having a greater horizontal extent than the representation according to the zoom window.

In a possible embodiment, the measurement apparatus comprises an input device. The input device may be configured to receive an indication specifying a horizontal position and/or a width of the zoom window.

The input device may be any kind of appropriate input device. For example, the input device may comprise a rotary knob or a number of input keys. Furthermore, the input device may be realized by means of a touch-screen. For example, a cursor may be moved over a representation of an overview of the measurement signal in order to specify a horizontal beginning and ending of the zoom window. However, any other kind of input device for specifying the horizontal dimension of the zoom window may be possible, too.

In a possible embodiment, the measurement device may be configured to acquire a further measurement signal. Additionally or alternatively, the measurement device may derive a further measurement signal from the acquired measurement signal. The processing device may be configured to vertically track the acquired further measurement signal to generate a further view representing a zoomed section of the further measurement signal. In particular, the vertical zooming of the acquired further measurement signal may be based on a tracking of the further measurement signal. Accordingly, the vertical dimension of the zoom window for the further measurement signal may be adapted in a manner corresponding to the tracking and zooming as described above in connection with the measurement signal.

In a possible embodiment, the measurement signal may comprise a display. The display may be configured to display the generated view.

The display may be, for example, a TFT display or an OLED display. However, any other kind of appropriate display may be possible, too. The generated view, and if applicable, further views may be displayed in appropriate windows. For example, a first window may be used for displaying an overview of the measurement signal, and a second window may be used for displaying the view with the zoomed representation. If further applicable, additional windows for displaying the further measurement signal may be possible, too.

With the present invention it is therefore now possible to provide a measurement device with an automated and improved configuration for applying a zooming of a signal waveform of a measurement signal. In particular, the vertical position and dimension of a zoom window may be automatically set according to the measurement values. In this way, the configuration for zooming the measurement signal may be applied automatically, at least in part. Thus, the measurement procedure may be simplified and improved. In particular, the required time period for applying a measurement can be reduced, and thus, the costs for testing a device under test can be minimized.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
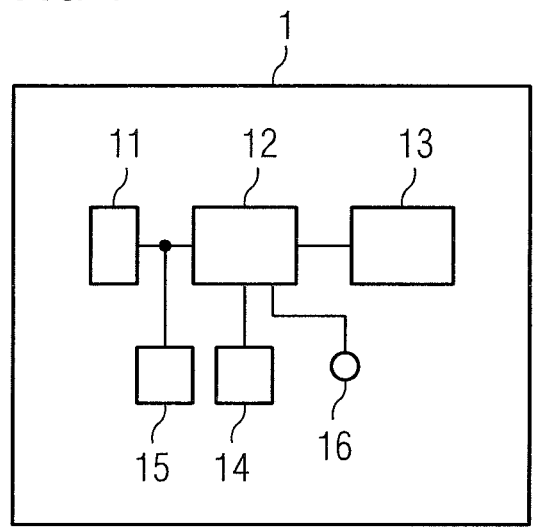
FIG. 1: shows a block diagram of an embodiment of a measurement apparatus according to an embodiment.

The appended drawings are intended to provide further understanding of the embodiments of the invention. They illustrate embodiments and, in conjunction with the description, help to explain principles and concepts of the invention. Other embodiments and may of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a block diagram of a measurement apparatus 1 according to an embodiment. The measurement apparatus 1 comprises a measurement device 11 and a processing device 12. The measurement device 1 may further comprise a display 13. Furthermore, the measurement apparatus 1 may comprise an input device 14 and/or an input button 16. However, it is understood that the measurement apparatus 1 may also comprise any other appropriate device for performing a desired measurement operation.

Measurement device 11 of measurement apparatus 1 may receive a number of one or more measurement signals. For example, measurement device 11 may comprise a number of one or more input terminals. Each input terminal may be connected with a corresponding signal source. For example, an input terminal may be connected with a measurement point of a device under test. Measurement device 11 may be also connected with a measurement antenna for receiving wireless signals. The received one or more signals may be acquired by measurement device 11. For this purpose, an analog signal may be converted to corresponding digital measurement data by means of an analog to digital converter. Furthermore, measurement device 11 may comprise additional components such as an amplifier, an attenuator, a filter or the like.

The acquired measurement signal, in particular the digital data of a measurement signal may be provided to processing device 12. Additionally or alternatively, the data of the acquired measurement signal may be stored in a measurement memory 15. For example, the acquisition of the measurement signal, the analog to digital conversion and/or the storing of the measurement data in memory 15 may be synchronized with a detection of a predetermined trigger event.

The acquired measurement signal may be further analyzed. For this purpose, a graphical representation of a signal waveform of the acquired measurement signal may be generated. The generated representation may be provided to a user. For example, the graphical representation of the signal waveform may be displayed on display 13. However, it may be also possible to print or plot the graphical representation or store the graphical representation in any appropriate manner.

For providing a graphical representation of the acquired measurement signal, a first view may be generated. The first view may represent an overview of the acquired measurement signal. For example, the acquired measurement signal may comprise a measurement signal of a predetermined period of time. Accordingly, the overview of the first view may comprise a representation of the signal waveform for the whole predetermined period of time. However, it may be also possible that only a part of the period of time may be provided by the overview in the generated first view.

As it may be rather difficult to identify details of the signal waveform in the generated first view, a second view may be generated. The second view may provide a zoomed section of the acquired measurement signal. For this purpose, a zoom window may be specified. The zoom window may specify at least a horizontal start position and an end position of a section which shall be zoomed. Alternatively, the zoom window may be also specified, for example, by a horizontal start position and a width of the zoom window. Any other characteristic for specifying a section of the acquired measurement signal which should be zoomed may be also possible.

The required parameters for specifying the zoom window may be entered, for example by input device 14. For example, input device 14 may comprise a rotary knob or keys for moving around a cursor on the first view. In particular, the first view may be displayed on a display 13, and a cursor may be overlaid on the first view for navigating through the overview of the acquired measurement signal in horizontal direction. Furthermore, it may be possible to specify a desired position of the cursor (and the corresponding zoom window) by means of a touch display.

Processing device 12 may further determine appropriate vertical parameters of a zoom window, i.e. an area of the signal waveform, which shall be provided in an enlarged representation. For this purpose the processing device 12 may determine a vertical position of the zoom window and a height of the zoom window. Alternatively, processing device 12 may determine an upper and lower limit of the zoom window. However, any other manner for specifying the desired zoom window, in particular the vertical properties of the desired zoom window may be also possible. For this purpose, processing device 12 may analyze the values of the measurement signal, in particular the values within a section of the measurement signal, which corresponds to the horizontal part of the zoom window. For example, processing device 12 may determine a minimum and a maximum value of the measurement signal. Based on the determined maximum and minimum value of the measurement signal within the section of the measurement signal corresponding to the horizontal selection of the zoom window, the vertical properties of the zoom window may be adapted accordingly. For example, the upper limit of the zoom window may set according to the maximum value of the measurement signal, and the lower boarder of the zoom window may be set according to the minimum value of the measurement signal. However, any other appropriate manner for determining vertical properties of the zoom window may be also possible. For example, a vertical position of the zoom window may be set according to a mean value, which may be computed by the processing device, or any other kind of statistical parameter. Furthermore, the height of the zoom window may be also set according to any appropriate data, for example a standard deviation or the like.

Processing device 12 may continuously track the zoom window. For this purpose, processing device 12 may continuously monitor the values of the measurement signal, in particular the values within a segment relating to the horizontal size of the zoom window, and determine appropriate horizontal parameters of the zoom window. In this way, the horizontal position and the size of the zoom window is continuously adapted to the values of the measurement signal. In particular, if the horizontal position of the zoom window refers to a specific position within a repetitive signal, e.g. a specific position with respect to a trigger event of a repetitive signal, the values within the zoom window may change for each period of the repetitive signal. In this case, the processing device 12 may adapt the vertical parameters of the zoom window continuously, i.e. for each period of the repetitive signal.

Alternatively, processing device 12 may track the zoom window and adapt the vertical parameters of the zoom window in predetermined time intervals. For example, the processing device 12 may track the zoom window in intervals of 10, 20, 50, 100 milliseconds, or 0.5, 1, 2, 5, 10 seconds. However, any other period of time may be possible, too.

Alternatively, it may be also possible that the vertical parameters of the zoom window are only determined upon request. For example, an input button 16 may be provided for receiving a user input. The input device 16 may be a button, a control panel of the measurement device. Input device 16 may be also realized by a soft key on a touchscreen. However, any other manner for implementing the input device 16 may be also possible. Each time a user operates the input device, i.e. the user presses the input button 16, and processing device 12 may track the zoom window and adapt the vertical parameters of the zoom window accordingly.

It may be also possible that the tracking of the zoom window and the determination of the vertical parameters of the zoom window is initiated when detecting a specific feature in the measurement signal. For example, the tracking of the zoom window may be initiated when detecting a particular feature, in particular a particular feature at a specific position, for example a particular feature within the segment of the measurement signal relating to the zoom window. The particular feature may be, for example, a rising edge, a falling edge, a measurement value exceeding a predetermined value or falling below a predetermined value, a pulse, or any other characteristic feature. Accordingly, processing device 12 may determine the vertical parameters of the zoom window each time when a predetermined feature is detected in the measurement signal.

Figure 2:
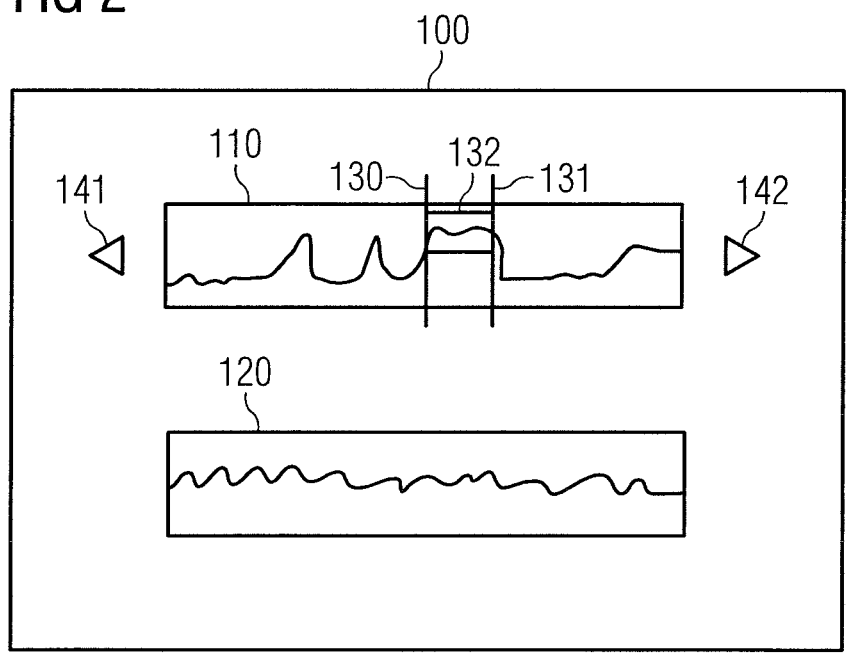
FIG. 2: shows a diagram illustrating a representation of the views generated by a measurement apparatus according to an embodiment.

FIG. 2 shows a schematic illustration of a representation comprising a first view 110 and a second view 120 generated by a measurement apparatus according to an embodiment. The representation 100 may comprise a first view 110 representing an overview of the acquired measurement signal. A cursor 130, 131 may be moved in horizontal direction along the first view in order to specify a desired position which shall be zoomed in horizontal direction. For example, the horizontal parameters of a zoom window 132 may be specified by cursors 130, 131 indicating the start position and the end position. Furthermore, the applied zoom window 132 may be also indicated in the first view 110. Optionally, soft keys 141, 142 may be provided for moving the cursors 130, 131. Additionally or alternatively, the cursors 130, 131 may be also positioned by a tap on a touch screen.

The representation 100 may further comprise a representation of a second view 120. As can be seen, the second view 120 may provide a zoomed representation of the selected zoom window 132. The zoom window 132, in particular the vertical parameters of the zoom window 132 may be set such that the zoomed signal waveform may fit the area of the zoomed representation. For example, the upper limit of the zoom window 132 is set such that the upper limit is slightly above the highest value of the measurement signal within the zoom window 132. Accordingly, the lower boarder of the zoom window 132 is set such that the lower broader is slightly below the lowest value of the measurement signal within the zoom window 132. However, any other appropriate scheme for adapting the vertical parameters of the zoom window 132 may be also possible. Accordingly, the zooming of the signal waveform, in particular the vertical and horizontal zooming, is set such that the zoomed signal waveform fits the whole size in the area for representing the zoomed signal waveform.

Figure 3:
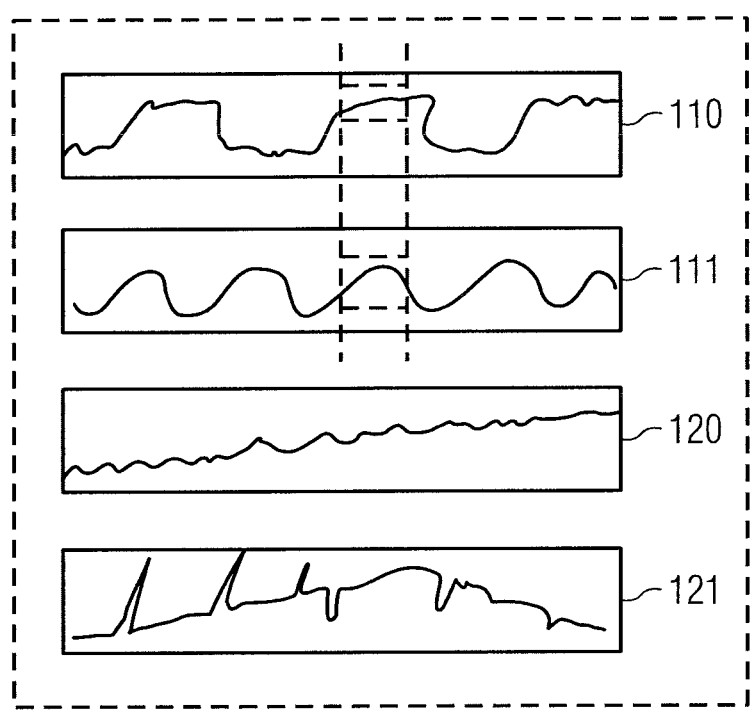
FIG. 3: shows an illustration of further views generated by a measurement apparatus according to an embodiment.

FIG. 3 shows an alternative representation 100 generated by a measurement apparatus 1 according to an embodiment. As can be seen in FIG. 3, further to the first view 110 of the acquired measurement signal, an additional overview 111 of a further measurement signal is provided. The additional measurement signal may be a further measurement signal acquired by measurement device 11. Additionally or alternatively, it may be also possible to derive a further signal based on the acquired measurement signal. For example, the further signal may be derived by applying a demodulation or any other operation on the acquired measurement signal.

Accordingly, in addition to the horizontally zoomed measurement signal in the second view 120, a corresponding horizontal zooming 121 of the further signal may be provided. For this purpose, a same horizontal zooming may be applied to the acquired measurement signal and the further signal.

The vertical zooming of the further measurement signal may be determined in the same manner as described above in connection with the vertical zooming of the acquired measurement signal. In particular, individual parameters for the vertical zoom window of the further measurement signal may be determined. Hence, the zoomed representation relating to the measurement signal and the zoomed representation of the further signal may refer to a same horizontal position. However, individual vertical parameters for the zoom windows may be determined.

Figure 4:
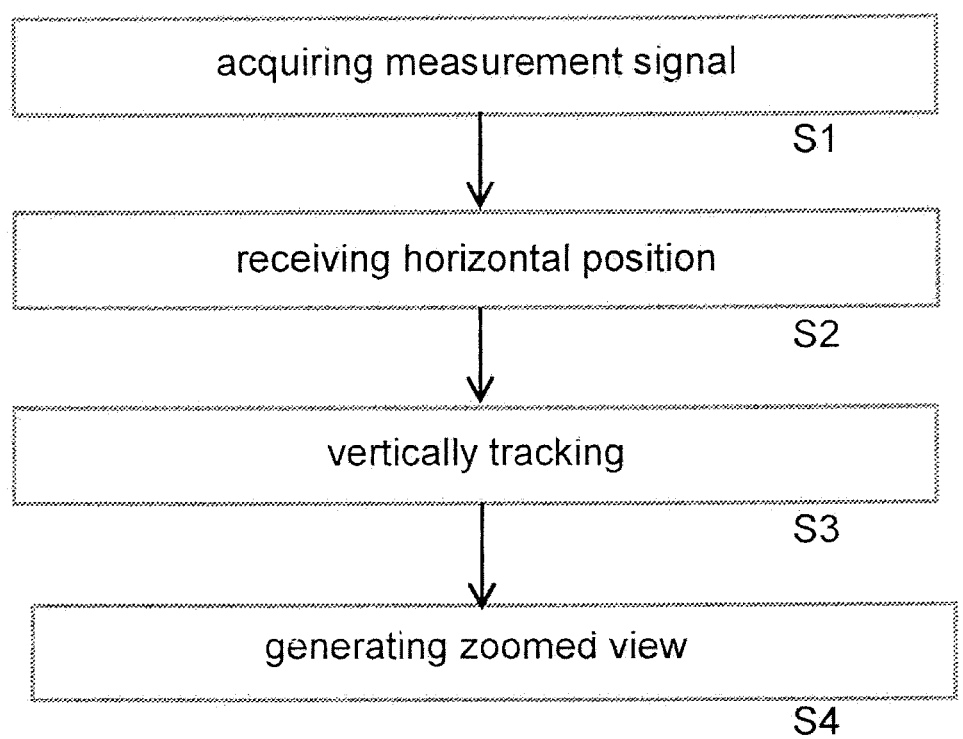
FIG. 4: shows a flow diagram of a measurement method according to an embodiment.

FIG. 4 shows a flow diagram of a measurement method according to an embodiment. The measurement method may comprise all steps as described above in connection with measurement apparatus 1. Accordingly, measurement apparatus 1 may also apply any kind of operation as described below in connection with the measurement method.

In a first step S1, a measurement signal is acquired. The measurement signal may be acquired by measurement device 11. In step S2, data for specifying a zoom window in horizontal direction are received. For example, a horizontal position and a width of a zoom window may be specified. The parameters may be received, for example, by a processing device 12. In step S3, a vertical tracking of the acquired measurement signal is performed. In particular, the vertical tracking may comprise determining vertical parameters of the zoom window. In step S4, a view is generated representing a zoomed section of the acquired measurement signal. The view may be generated according to the zoom window. The vertical zooming of the acquired measurement signal may be based on the vertical tracking. The reception of the horizontal parameters of the zoom window, the vertical tracking and the generation of the view may be performed by the processing device 12.

The vertical tracking of the acquired measurement signal may comprise adapting a vertical position of the zoom window. Additionally or alternatively, the vertical tracking may comprise adapting a vertical zoom factor. The determination of the vertical position and/or the vertical zoom factor may be performed according to the values of the acquired measurement signal in the zoom window.

The vertical tracking of the acquired measurement signal may be performed when a predetermined event is detected.

The method may comprise receiving a user input, in particular receiving a user input from an input button. Accordingly, the vertical tracking may be performed when a user input is received.

Alternatively, the vertical tracking may be performed continuously. In particular, the vertical tracking of the acquired measurement signal may be performed periodically, especially in predetermined time intervals.

The method may comprise generating a further view representing an overview of the acquired measurement signal.

The method may comprise receiving an indication for specifying a horizontal position and/or a width of the zoom window. In particular, the indication for specifying horizontal parameters of the zoom window may be received from an input device.

The method may comprise acquiring a further measurement signal. Additionally or alternatively, the method may derive a further measurement signal from the acquired measurement signal. Accordingly, a vertical tracking of the acquired further measurement signal may be performed. A further view representing a zoom section of the further measurement signal may be generated. The vertical zooming of the acquired further measurement signal may be based on the tracking of the further measurement signal.

The method may display the generated view. In particular, the generated view may be displayed on a display of a measurement apparatus.

Summarizing, the present invention provides an automated zooming of a signal waveform. In particular, vertical parameters of a zoom window for zooming a signal waveform may be automatically determined. For this purpose, an acquired measurement signal is tracked and the parameters of the zoom window are set based on the tracking of the measurement signal.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement apparatus, comprising:
a measurement device for acquiring a measurement signal;
a processing device for receiving a horizontal position of a zoom window, and generating a view to be displayed representing a zoomed section of the acquired measurement signal according to the zoom window;
wherein the processing device is configured to vertically track the acquired measurement signal, and to adapt a vertical zooming of the acquired measurement signal based on the vertical tracking;
wherein vertically tracking the acquired measurement signal comprises monitoring values of the measurement signal within a segment relating to a horizontal size of the zoom window, determining horizontal parameters of the zoom window based on the monitored values, and automatically setting by the processing device a horizontal position and a size of the zoom window for the view according to the determined horizontal parameters of the zoom window; and
wherein processing device is configured to perform a statistical analysis of values of the measured signal to determine at least one statistical parameter of the measured signal and to automatically set the horizontal position and the size of the zoom window for the view according to the at least one statistical parameter of the statistical analysis.

2. The apparatus of claim 1, wherein vertically tracking the acquired measurement signal comprises adapting a vertical position of the zoom window and/or adapting a vertical zoom factor according to the values of the acquired measurement signal in the zoom window.

3. The apparatus of claim 1, wherein the processing unit is configured to perform the vertical tracking of the acquired measurement signal when a predetermined event in the measurement signal is detected.

4. The apparatus of claim 1, comprising an input button for receiving a user input,
wherein the processing unit is configured to perform the vertically tracking when a user input is received by the input button.

5. The apparatus of claim 1, wherein the processing unit is configured to continuously perform the vertical tracking of the acquired measurement signal.

6. The apparatus of claim 1, wherein the processing unit is configured to perform the vertical tracking of the acquired measurement signal periodically in predetermined time intervals.

7. The apparatus of claim 1, wherein the processing unit is configured to generate a further view representing an overview of the acquired measurement signal.

8. The apparatus of claim 1, comprising an input device for receiving an indication specifying a horizontal position and/or the width of the zoom window.

9. The apparatus of claim 1, wherein the measurement device is configured to acquire a further measurement signal or to derive a further measurement signal from the acquired measurement signal,
- wherein the processing device is configured to vertically track the acquired further measurement, and to generate a further view representing a zoomed section of the further measurement signal;
- wherein a vertical zooming of the acquired further measurement signal based on the vertical tracking of the further measurement signal.

10. The apparatus of claim 1, comprising a display for displaying the generated view.

11. A measurement method, comprising:
- acquiring a measurement signal by a measurement device;
- receiving a horizontal position of a zoom window by a processing device;
- vertically tracking the acquired measurement signal by the processing device; and
- generating by the processing device a view to be displayed representing a zoomed section of the acquired measurement signal according to the zoom window;
- wherein a vertical zooming of the acquired measurement signal is based on the vertical tracking;
- wherein vertically tracking by the processing device the acquired measurement signal comprises monitoring values of the measurement signal within a segment relating to a horizontal size of the zoom window, determining horizontal parameters of the zoom window based on the monitored values, and automatically setting a horizontal position and a size of the zoom window for the view according to the determined horizontal parameters of the zoom window; and
- wherein the method further comprises performing a statistical analysis of values of the measured signal to determine at least one statistical parameter of the measured signal and automatically setting the horizontal position and the size of the zoom window for the view according to the at least one statistical parameter of the statistical analysis.

12. The method of claim 11, wherein the vertically tracking the acquired measurement signal comprises adapting a vertical position of the zoom window and/or adapting a vertical zoom factor according to the values of the acquired measurement signal in the zoom window.

13. The method of claim 11, wherein the vertical tracking of the acquired measurement signal is performed when a predetermined event is detected.

14. The method of claim 11, comprising receiving a user input, wherein the vertically tracking is performed when the user input is received.

15. The method of claim 11, wherein the vertical tracking is performed continuously.

16. The method of claim 11, wherein the vertical tracking of the acquired measurement signal is performed periodically in predetermined time intervals.

17. The method of claim 11, comprising generating a further view representing an overview of the acquired measurement signal.

18. The method of claim 11, comprising receiving an indication specifying a horizontal position and/or the width of the zoom window.

19. The method of claim 11, comprising acquiring a further measurement signal or deriving a further measurement signal from the acquired measurement signal;
- vertically tracking the acquired further measurement signal; and
- generating a view representing a zoomed section of the further measurement signal;
- wherein a vertical zooming of the acquired further measurement signal based on the vertical tracking of the further measurement signal.

20. The method of claim 11, comprising displaying the generated view.

* * * * *